United States Patent
Shore et al.

(10) Patent No.: US 6,292,421 B1
(45) Date of Patent: Sep. 18, 2001

(54) METHOD AND APPARATUS FOR MULTIPLE ROW ACTIVATION IN MEMORY DEVICES

(75) Inventors: Michael A. Shore, Boise; Patrick J. Mullarkey, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/629,573

(22) Filed: Jul. 31, 2000

Related U.S. Application Data

(62) Division of application No. 09/384,134, filed on Aug. 27, 1999, now Pat. No. 6,115,306, which is a division of application No. 09/145,865, filed on Sep. 2, 1998, now Pat. No. 6,023,434.

(51) Int. Cl.[7] ..................................................... G11C 7/00
(52) U.S. Cl. ......................... 365/222; 365/230.6; 365/201
(58) Field of Search ............................... 365/201, 230.06, 365/222, 230.08

(56) References Cited

U.S. PATENT DOCUMENTS

| | | | |
|---|---|---|---|
| 4,879,685 | 11/1989 | Takemae | 365/189.11 |
| 5,022,007 | 6/1991 | Arimoto et al. | 365/201 |
| 5,287,312 | 2/1994 | Okamura | 365/230.06 |
| 5,289,475 | 2/1994 | Slemmer | 365/201 |
| 5,381,368 | 1/1995 | Morgan et al. | 365/189.01 |
| 5,396,464 | 3/1995 | Slemmer | 365/201 |
| 5,396,466 | 3/1995 | Nakano et al. | 365/201 |
| 5,432,744 | 7/1995 | Nagata | 365/230.06 |
| 5,440,517 | 8/1995 | Morgan et al. | 365/202 |
| 5,495,448 | * 2/1996 | Sachdev | 365/201 |
| 5,555,212 | 9/1996 | Toshiaki et al. | 365/200 |
| 5,615,164 | 3/1997 | Kirihata et al. | 365/230.06 |
| 5,684,809 | 11/1997 | Stave et al. | 371/27 |
| 5,706,233 | * 1/1998 | Doishi | 365/230.06 |
| 5,715,206 | * 2/1998 | Lee et al. | 365/222 |
| 5,754,486 | 5/1998 | Nevill et al. | 365/201 |
| 5,936,899 | 8/1999 | Jeong | 365/230.06 |
| 5,936,910 | 8/1999 | Hashimoto | 365/230.06 |
| 5,949,724 | 9/1999 | Kang et al. | 365/230.06 |
| 5,995,429 | 11/1999 | Kojima et al. | 265/201 |

* cited by examiner

*Primary Examiner*—Tan T. Nguyen
(74) *Attorney, Agent, or Firm*—Dorsey & Whitney LLP

(57) ABSTRACT

A memory device test circuit and method are described. These operate to maintain a local phase signal active over multiple row activate commands. As a result, an arbitrary number of word lines may be activated together, in an arbitrary order and in arbitrary locations, in response to user-programmable instructions. This allows test sequences to be tailored after the memory device has been designed and can greatly reduce testing times for memory devices.

27 Claims, 10 Drawing Sheets

METHOD AND APPARATUS FOR MULTIPLE ROW ACTIVATION IN MEMORY DEVICES

CROSS-REFERENCE TO RELATED APPLICATIONS

This application is a divisional of pending U.S. patent application Ser. No. 09/384,134, filed Aug. 27, 1999, now U.S. Pat. No. 6,115,306 which is a divisional of U.S. patent application Ser. No. 09/145,865, filed Sep. 2, 1998, which issued Feb. 8, 2000, as U.S. Pat. No. 6,023,434.

TECHNICAL FIELD

This invention relates to integrated circuit memory devices, and, more particularly, to a method and apparatus for writing data to memory devices in a manner that expedites testing of memory devices and increases testing flexibility.

BACKGROUND OF THE INVENTION

Integrated circuits are extensively tested both during and after production and, in some cases, routinely during use after they have been installed in products. For example, memory devices, such as dynamic random access memories ("DRAMs"), are tested during production at the wafer level and after packaging, and they are also routinely tested each time a computer system using the DRAMs executes a power up routine when power is initially applied to the computer system. DRAMs are generally tested by writing known data to each location in the memory and then reading data from each memory location to determine if the read data matches the written data. As the capacity of DRAMs and other memory devices continues to increase, the time required to write and then read data from all memory locations continues to increase, even though memory access times continue to decrease.

Various proposals have been made to decrease the time required to test memory devices, such as DRAMs. The time required to write known data to memory devices has been reduced by such approaches as simultaneously writing the same data to each column of each array in the memory device one row at a time. However, some types of testing require that the word lines be kept at a fixed positive voltage for an extended period of time, such as tens of milliseconds. When there are thousands of word lines in one memory device, this testing takes long periods of time since only one word line in each bank of the memory device may be accessed at a time.

Other approaches for reducing testing time include internal circuitry for transferring data from each column of one row to the next row without requiring the memory to be addressed. These approaches have reduced the time required to write known data or a known pattern of data to the memory array. However, when the initial or "seed" row to which data are written is defective, this approach to speeding of testing fails.

Additionally, it is very difficult to assess some error margins. In testing one type of error margin, known as "writeback margin", it is difficult to measure slew rates at which circuitry involved in writing new data to memory cells limits a maximum clock frequency at which the memory device may continue to operate reliably. Since several different portions of the memory device may limit the maximum clock frequency, a series of simple "go-no go" tests at increasing clock frequencies will not provide insight into which mechanism is limiting the maximum clock frequency.

A new memory device design may be empirically found to be susceptible to certain defects, that are most readily and efficiently identified through testing using one or more combinations of rows that could, not be anticipated when the memory device was designed. Accordingly, only having a capability to invoke tests using combinations of rows chosen from a limited number of pre-programmed combinations is less than optimal.

In the prior art approaches to writing the same data to multiple rows, the rows are often activated at the same time. As a result, large currents are induced in the memory device, sometimes causing signals to be coupled into unintended memory locations and providing the appearance of memory device failure when the memory device may be capable of normal operation.

There is therefore a need to be able to write data to a memory device, while reducing testing time and increasing testing flexibility, that can be implemented on integrated circuits having memory arrays.

SUMMARY OF THE INVENTION

In accordance with one aspect of the present invention, a test circuit for a memory device having at least one array of memory cells arranged in rows and columns selectively operates in either a normal mode or a test mode. When operating in the normal mode, the test circuit couples one row of the array to one active word line driver circuit. When operating in the test mode, the test circuit maintains local phase driving signals in an active state over multiple consecutive row activate commands, allowing multiple rows of the memory device to be accessed at the same time in a programmable fashion.

As a result, when tests of a memory cell or other memory device structure involve holding a memory cell or a word line in a specific state or at a specific voltage for an extended period of time, multiple word lines may be sequentially addressed and then tested together. This greatly reduces testing time.

Additionally, by sequentially turning on individual rows, the currents charging the word lines are spread out over time, substantially reducing switching noise that can cause interference with the proper operation of other portions of the memory device. This is useful in a variety of stress tests where multiple rows are activated, such as half-rows high, all rows high and other tests where a groups of rows are tested together.

Additionally, in another aspect of the present invention, the tester may use software control to program any multiple row activation test pattern as desired after the memory devices have been fabricated. This permits the tester to change testing sequences to resolve fabrication problems or to provide for other specialized test needs that develop after the memory device has been designed.

Further, according to another aspect of the present invention, a tester is able to compensate for problems where a first row, known as a "seed" row, is programmed with data that are then propagated from one memory cell to another through portions of the memory device before being read external to the memory device. When the seed row is defective, test software can automatically select a different row as the seed row or can rewrite data to the seed row.

DETAILED DESCRIPTION OF THE INVENTION

Figure 1:
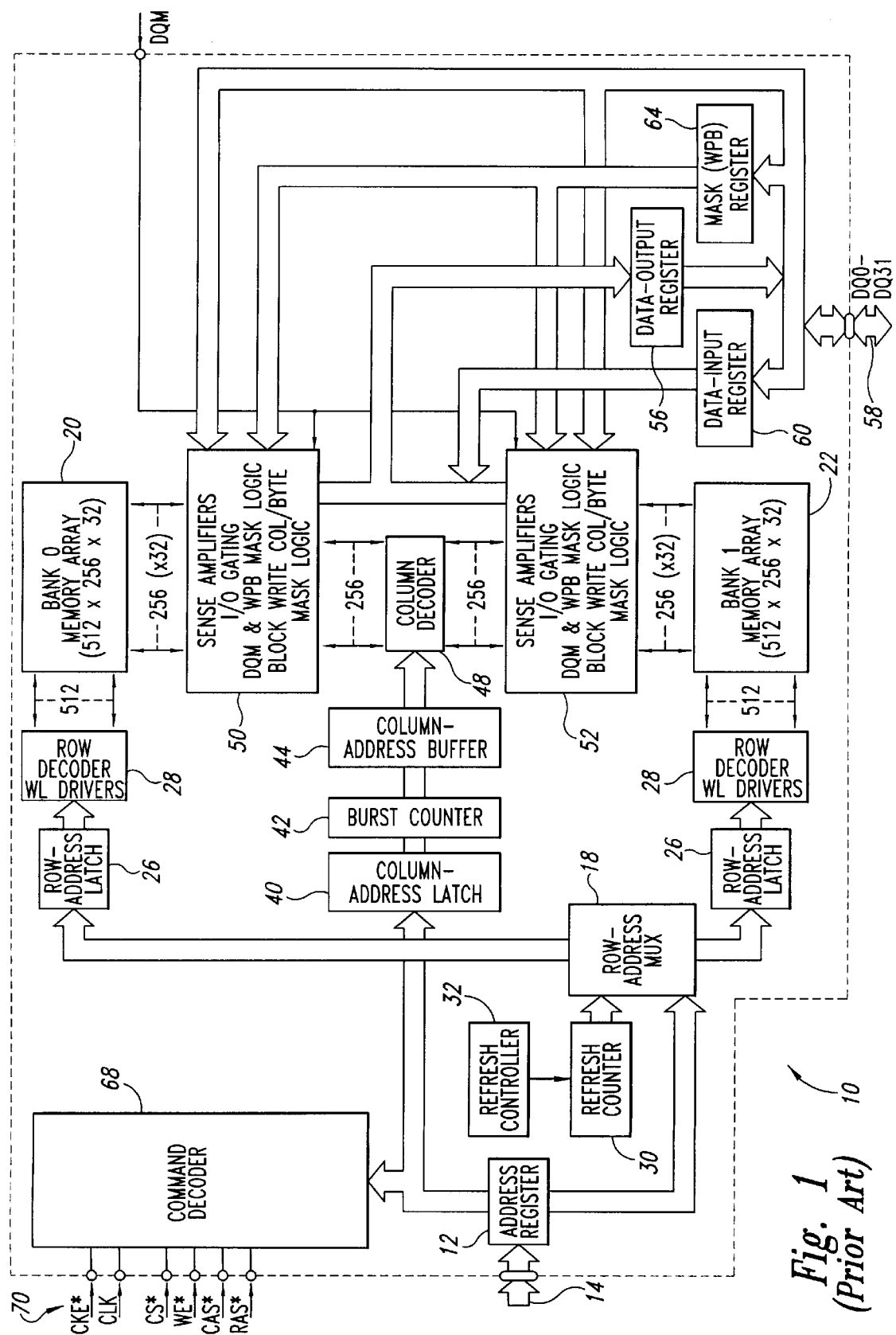
FIG. 1 is a simplified block diagram of a conventional memory device that may use an embodiment of a test circuit in accordance with the present invention.
Figure 4:
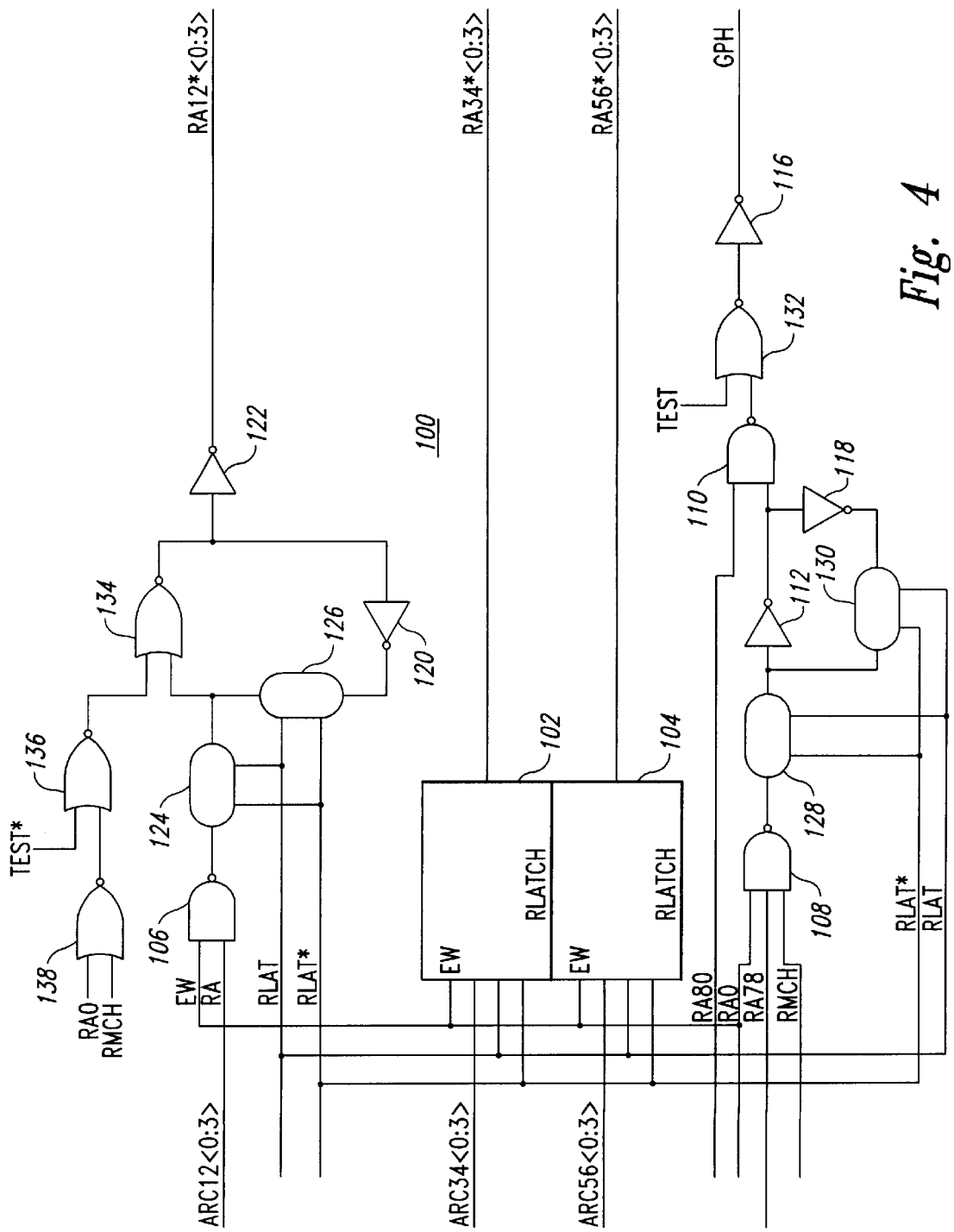
FIG. 4 is a simplified schematic diagram of a test circuit useful in the memory device of FIG. 1 in accordance with an embodiment of the present invention.
Figure 5:
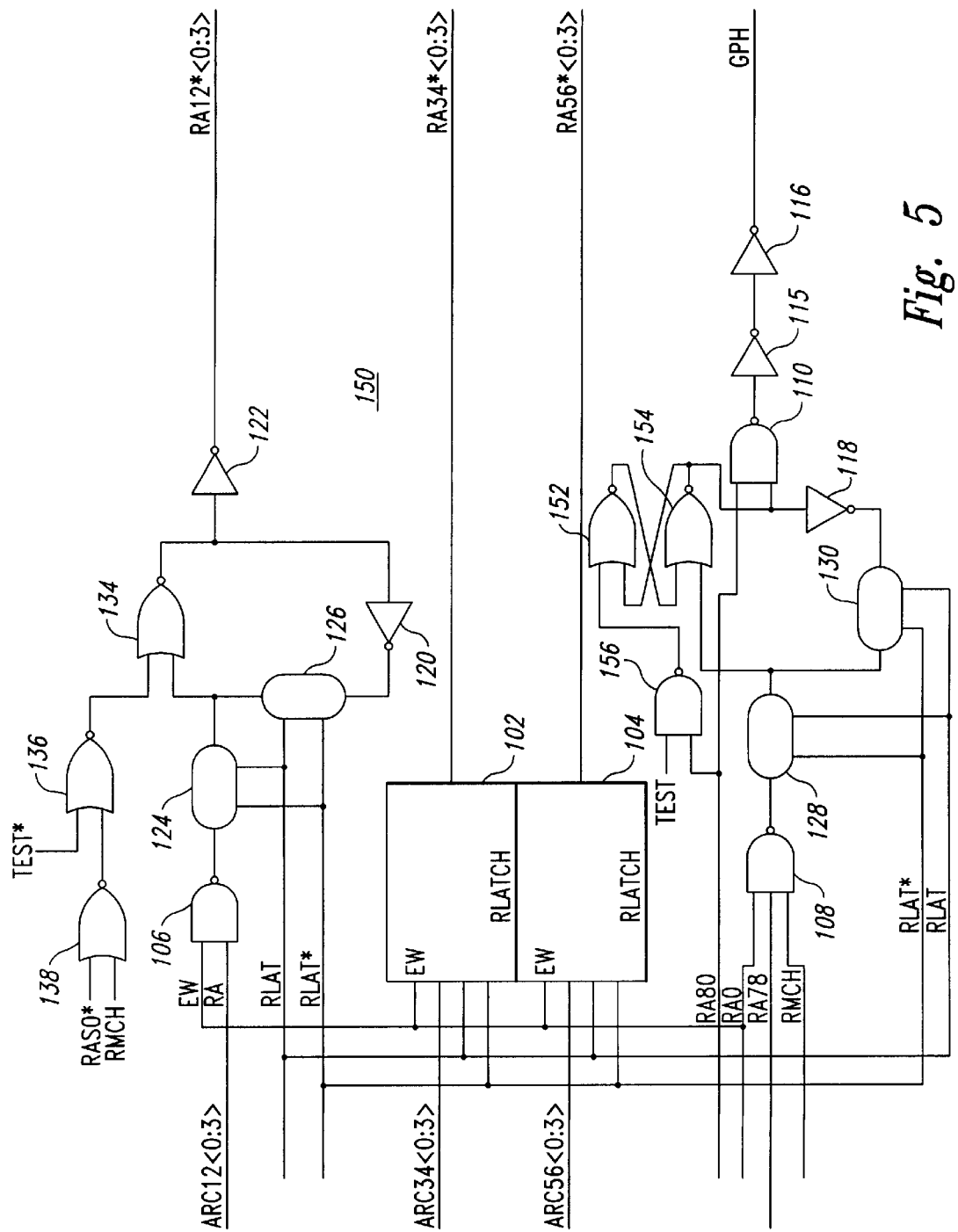
FIG. 5 is a simplified schematic diagram of another test circuit useful in the memory device of FIG. 1 in accordance with an embodiment of the present invention.

FIG. 1 illustrates a conventional memory device 10 that can advantageously use embodiments of test circuits illustrated in FIGS. 4 and 5 in accordance with the present invention. The memory device 10 shown in FIG. 1 is a synchronous dynamic random access memory ("SDRAM") 10, although the test circuits may also be used in other DRAM's and other memory devices. The SDRAM 10 includes an address register 12 that receives either a row address or a column address on an address. bus 14. The address bus 14 is generally coupled to a memory controller (not shown). Typically, a row address is initially received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26, which stores the row address, and a row decoder 28, which applies various signals to its respective memory bank 20 or 22 as a function of the stored row address. The row address multiplexer 18 also couples row addresses to the row address latches 26 to refresh memory cells in the memory banks 20, 22. The row addresses are generated for refresh purposes by a refresh counter 30 that is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42 which applies a sequence of column addresses to the column address buffer 44 starting at the column address that is output by the address register 12. In either case, the column address buffer 44 supplies a column address to a column decoder 48 which applies various column signals to respective sense amplifiers and associated column circuitry 50, 52 for the respective memory banks 20, 22.

Data to be read from one of the memory banks 20, 22 are coupled to the column circuitry 50, 52 for one of the memory banks 20, 22, respectively. The data are then coupled to a data output register 56 which applies the data to a data bus 58. Data to be written to one of the memory banks 20, 22 are coupled from the data bus 58 through a data input register 60 to the column circuitry 50, 52 and then are transferred through word line driver circuits in the column circuitry 50, 52 to one of the memory banks 20, 22, respectively. A mask register 64 may be used to selectively alter the flow of data into and out of the column circuitry 50, 52, such as by selectively masking data to be read from the memory banks 20, 22.

The above-described operation of the SDRAM 10 is controlled by a command decoder 68 responsive to high level command signals received on a control bus 70. These high level command signals, which are typically generated by a memory controller (not shown in FIG. 1), are a clock enable signal CKE*, a clock signal CLK, a chip select signal CS*, a write enable signal WE*, a column address strobe signal CAS*, and a row address strobe signal RAS*, with the "*" designating the signal as active low or complement. The command decoder 68 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these control signals will be omitted.

Figure 2:
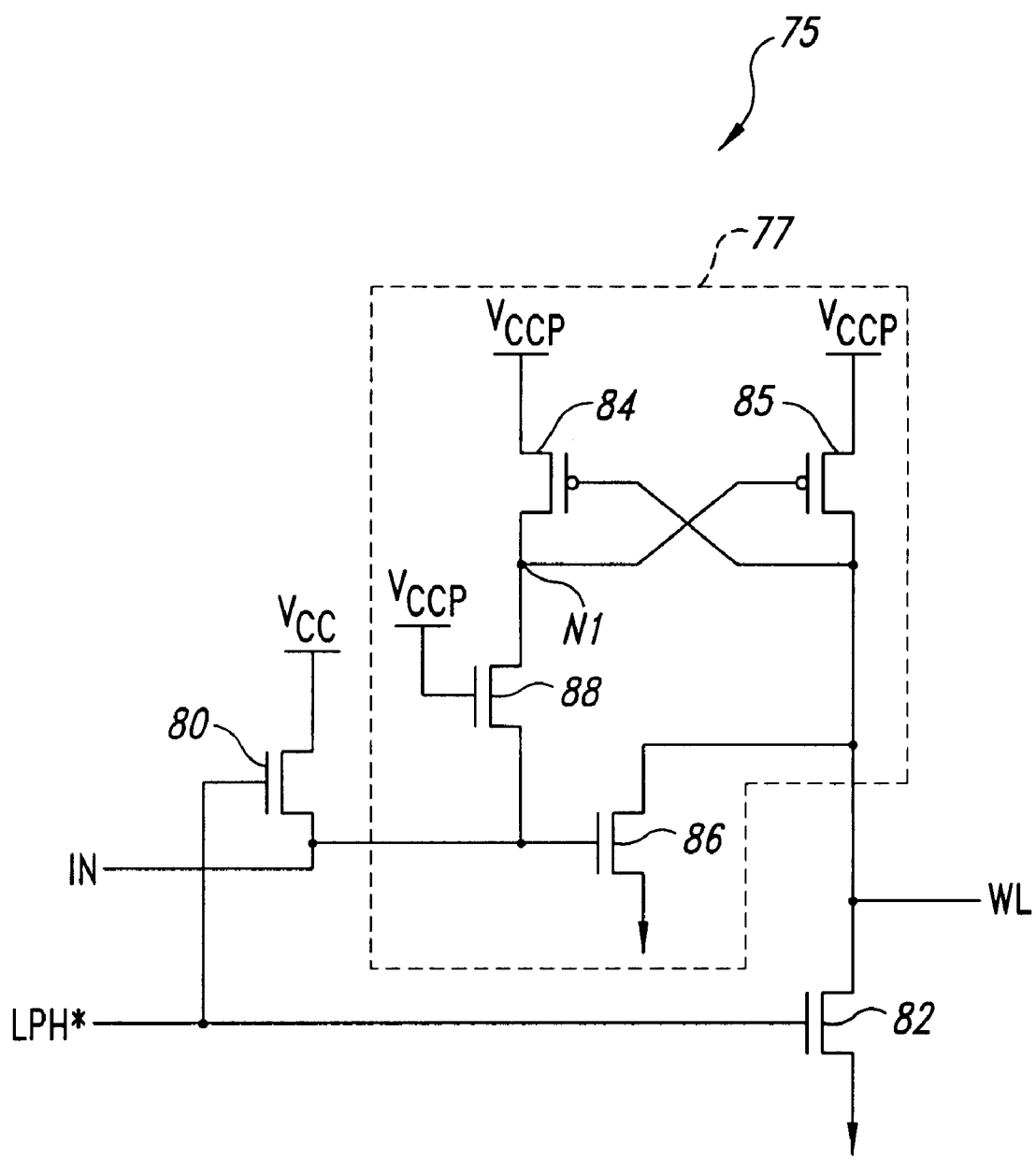
FIG. 2 is a simplified schematic diagram of a word line driver circuit within a row decoder for each row of the memory device of FIG. 1 that can advantageously be used with an embodiment of the present invention.
Figure 3A:
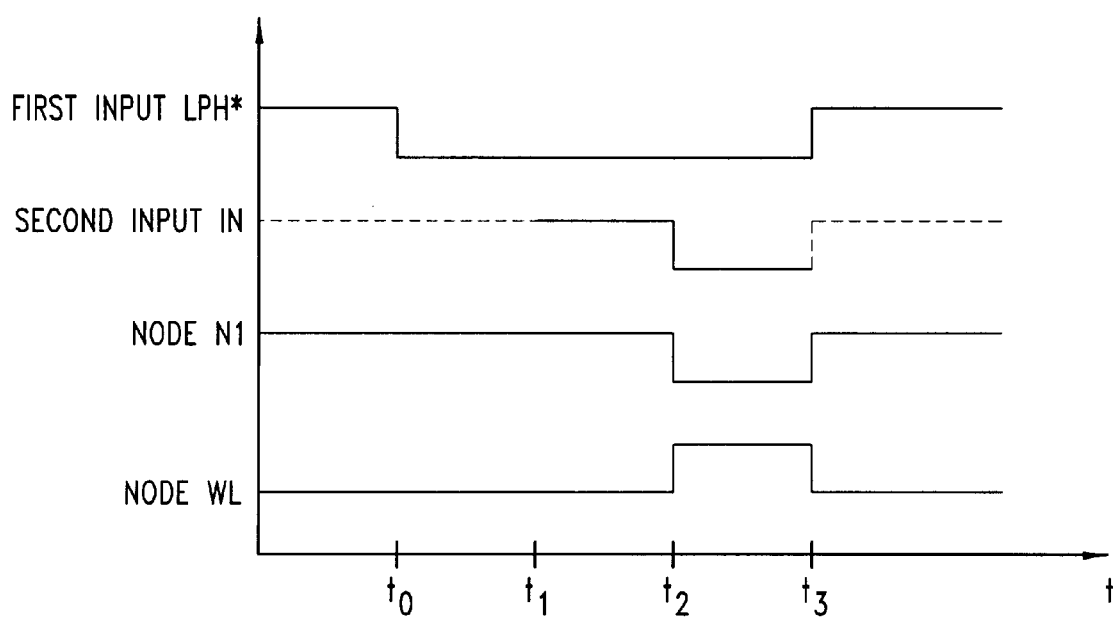
FIGS. 3A and 3B are simplified timing diagrams illustrating waveforms for the circuit of FIG. 2 operating in a normal mode, in accordance with the prior art, and in a test mode, in accordance with embodiments of the present invention, respectively.
Figure 3B:
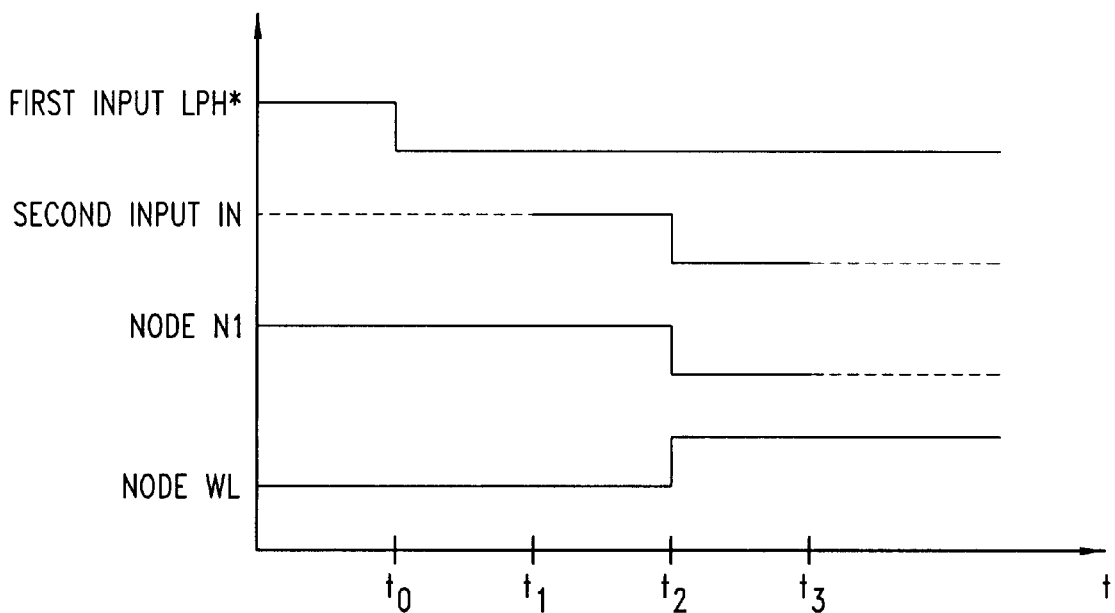

FIG. 2 is a simplified schematic diagram of one embodiment of a word line driver circuit 75 in accordance with the prior art that may be advantageously used in accordance with embodiments of the present invention. FIGS. 3A and 3B are timing diagrams illustrating waveforms for the circuit of FIG. 2 operating in a normal mode, in accordance with the prior art, and in a test mode, in accordance with embodiments of the present invention, respectively.

Each word line in the memory banks 20, 22 of FIG. 1 is coupled to gates of a plurality of access transistors (not illustrated) for respective columns in each row. When the access transistor in an addressed column is turned ON, it couples a memory cell to one of a pair of complementary digit lines for that column. An access transistor is thus provided for each column in each row of each array 20, 22. For the access transistors in each row to turn ON, the voltage applied to their gates by the respective word line drive circuit 75 must be greater than the voltage present on a digit line coupled to the source of the access transistor. The voltage on the digit line is normally either a supply voltage $V_{CC}$ or ground when data is being written to the memory cell. However, since the access transistors are normally NMOS transistors, the voltage applied to their gates must be greater than $V_{CC}$ by the magnitude of the threshold voltage of the access transistors for the access transistors to be able to apply V to their memory cells. Accordingly, the word line driver circuit 75 includes a level translator circuit 77 that allows the word line driver circuit 75 to output signals that vary between ground or logic "0" and $V_{CCP}$, which is a voltage 1.0 volts or more greater than $V_{CC}$. As a result, the access transistor can be turned ON when the source of the memory cell transistor is at $V_{CC}$ during a write operation.

In a normal mode of operation and as a part of a conventional precharge sequence, the word line driver circuit 75 has a first input LPH*, known as "local phase complement." The first input LPH* is active low and is normally high (at logic "1") until, at a time to (see FIG. 3A), the memory device 10 is ready to write data to a selected memory cell coupled to that word line driver circuit 75. The word line driver circuit 75 has a second input IN that is selected by the row decoder 28 of FIG. 1 when a row address corresponding to the row coupled to the word line driver circuit 75 is selected. The second input IN is coupled to a tristate drive circuit (not shown) that provides a word line driver circuit selection signal and that provides a high impedance (dashed trace, FIG. 3A) when the tristate drive circuit is not active.

The second input IN is initially (i.e., prior to time $t_0$) at logic "1" because the logic "1" at the first input LPH* turns ON a NMOS transistor 80, which then couples the second input IN to $V_{CC}$. The NMOS transistor 80 has a source coupled to $V_{CC}$ and a drain coupled to the second input IN. Because the first input LPH* is initially set to logic "1," an output node WL is set to logic "0" by a NMOS transistor 82, which is turned ON by the signal at the first input LPH*. A PMOS transistor 84 is also initially turned ON because the output node WL is set to logic "0." In turn, a PMOS transistor 85 is turned OFF because the node N1 is coupled to $V_{CCP}$ by the ON PMOS transistor 84.

At time $t_0$, the first input LPH* is switched active low in all of the word line driver circuits 75, turning OFF the NMOS transistor 82, but the output node WL is maintained at logic "0" by a NMOS transistor 86, which continues to be turned ON by the logic "1" present at the second input IN. Until time $t_1$, the tristate driver circuit is in the high impedance state, and the second input IN acts as a capacitor, maintaining the initial logic "1" due to the signal at the first input LPH* having been at logic "1". At time $t_1$, the tristate driver circuit switches from the high impedance state to logic "1" (solid trace, second input IN, FIG. 3A).

When one of the word line driver circuits 75 is addressed at time $t_2$ (FIG. 3A), the second input IN in that word line driver circuit 75 changes to logic "0", turning the NMOS transistor 86 OFF. The second input IN being logic "0" turns an NMOS transistor 88 ON, setting a node N1 low. Setting the node N1 low turns the PMOS transistor 85 ON, thereby driving the output node WL to $V_{CCP}$ and turning OFF the PMOS transistor 84. In accordance with the prior art, the tristate drive circuit coupled to the second input IN becomes high impedance after $t_3$ at the end of writing data into a memory cell, maintaining the voltage present on the second input IN, and thereby maintaining the voltage present on the node N1. In the normal mode of operation, the signal to the first input LPH* then becomes inactive high at time $t_3$, turning the NMOS transistor 82 ON and causing the voltage present on the output node WL to decrease towards ground, tuning the PMOS transistor 84 ON. In turn, the voltage on the node N1 increases to $V_{CCP}$, turning the PMOS transistor 85 OFF. As a result, the output node WL is no longer enabled and is coupled to ground or logic "0."

In a test mode of operation in accordance with the present invention, the PMOS transistors 84, 85 and the NMOS transistors 86, 88 of the word line driver circuit 75 are also able to act as a dynamic latch. Prior to the time $t_2$, the word line driver 75 input and output signals of FIGS. 3A and 3B are identical for both the normal and test modes of operation.

When the signal coupled to the first input LPH* is maintained active low at logic "0" after time $t_3$, the word line driver circuit 75 remains latched with the output node WL at a voltage of $V_{CCP}$ until leakage currents cause the output node WL to discharge enough, or until leakage currents cause the node N1 to charge enough, to turn the PMOS transistor 84 ON and to turn the PMOS transistor 85 OFF. As a result, when the signal coupled to the first input LPH* is maintained at logic "0" following the return of the tristate drive circuit coupled to the second input IN to a high impedance state after time $t_3$, the word line that was just selected will remain selected while the row decoder 28 of FIG. 1 selects and triggers another word line driver circuit 75 to activate that word line driver circuit 75.

The ability to successively activate subsequent word lines while keeping active the word lines that have already been activated allows a variety of tests to be conducted more efficiently. For example, when tests of a memory cell or other structure are being conducted that involve holding a memory cell or a word line in a specific state or at a specific voltage for an extended period of time, multiple word lines may be sequentially addressed and thus tested together. This greatly reduces testing time.

Additionally, some prior art tests turn on multiple word lines but do so simultaneously. The word lines provide a capacitive load, resulting in large charging currents and thereby generating substantial noise or interference due to capacitive coupling. This noise is coupled to other portions of the memory device 10 and, in particular, results in excessive coupling of signals between activated row: lines and associated digit lines. By sequentially turning on individual rows, the currents charging the word lines are spread out in time, substantially reducing this source of interference. This is useful in a variety of prior art stress tests where multiple rows are activated, such as half-rows high, all rows high and other tests where groups of rows are turned on and then stay on together. Further, when testing patterns that turn on multiple rows are programmed into the row decoder 28 of FIG. 1 during the design of the memory device 10, only a limited number of test patterns are programmed, and. these test patterns are determined before the first memory device 10 of this design is. fabricated. Some of the problems that may be encountered in fabricating large numbers of memory devices 10 using this design may be more efficiently tested for by using a test pattern that cannot be predicted before the memory devices 10 have been fabricated. The present invention allows the tester to use software control to program any multiple row activation test pattern as desired after the memory devices 10 have been fabricated in order to address problems that develop after the memory device 10 has been fabricated.

In some tests, a first row, known as a "seed" row, is programmed with data that are then propagated from one memory cell to another through portions of the memory device 10 before being read external to the memory device 10. When the seed row is defective, or when an error occurs in writing data to the seed row, and the test sequence is preprogrammed into the row decoder 28, the prior art does not allow either the seed row or another row to be written with new data in order to allow testing to proceed. Embodiments of the present invention solve this problem by allowing test software to automatically select a different row as the seed row or to rewrite data to the seed row.

There are several ways that a test signal TEST can maintain the signal coupled to the first input LPH* in an active state (e.g., active low) in the test mode of operation, allowing activation of multiple word line driver circuits 75 in accordance with embodiments of the present invention. One embodiment (not shown) includes one extra NMOS transistor in each word line driver circuit 75.

A gate of the extra NMOS transistor is coupled to the output node WL, a drain of the extra NMOS transistor is coupled to the node N1 and a source of the extra NMOS transistor is coupled to a drain of another NMOS transistor by a line extending from each word line driver circuit 75 to a common node.

The another NMOS transistor is shared by multiple word line driver circuits 75 and has a gate coupled to the 'signal TEST and a source coupled to ground. The extra NMOS transistor maintains the voltage on the node N1 by compensating for leakage currents that result in the voltage present on the output node WL decreasing from $V_{CCP}$ towards ground. A disadvantage of this approach is that the extra NMOS transistor is required in each word line driver circuit 75. The DRAM memory device 10 of FIG. 1 includes over sixteen thousand word line driver circuits 75. This embodiment thereby requires over sixteen thousand of the extra NMOS transistors, and twenty or more additional lines across the chip.

A technique in accordance with embodiments of the present invention for maintaining the voltage on the output node WL at $V_{CCP}$ refreshes the word line driver circuit 75 at suitable intervals by resetting the second input IN to logic "0" and thus retriggering the dynamic latch. For example, when a group of 64 rows is repeatedly selected with a cycle time of 20 nanoseconds between row activation commands, each word line driver circuit 75 will be refreshed every 1.28 microseconds. These techniques may be used to maintain the signal coupled to the first input LPH* active low, and the voltage on the output node WL near $V_{CCP}$, during consecutive row activate commands.

FIG. 4 is a simplified schematic diagram of a test circuit 100 useful in the memory device 10 of FIG. 1 in accordance with an embodiment of the present invention. The test circuit 100 is a portion of the even row drivers of the row address latch 26 of FIG. 1, and includes row sublatches 102 and 104, NAND gates 106–110, inverters/buffers 112–122, multiplexers 124–130 and NOR gates 132–138. Only the NOR gates 132–138 are not conventional, and, in the interest of brevity, only the NOR gates 132–138 will be discussed here.

The NOR gate 132 has an input coupled to the signal TEST. When the signal TEST is active high, all of the global phase driver signals GPH are maintained active high. As a result, all of the local phase driver signals coupled to the first input LPH* (FIG. 2) are maintained active low. The NOR gate 132 replaces an inverter normally used in the even row driver portion of the row address latch 26. The NOR gate 132 acts as an inverter when the signal TEST is inactive low. The test circuit 100 eliminates signals RA0, RA7 and RA8 (row addresses 0, 7 and 8) and redundant match decoding from the phase driver signal path.

The signals TEST*, RA0 (RA0* is used in odd row driver paths) and RMCH (redundant match) are coupled to combinatorial logic formed from NOR gates 134–138, inverters 120 and 122 and multiplexer 126 to re-incorporate the signals RA0 and RMCH into a predecoding path as will be understood by those of skill in the art. Similarly, the signals RA7 and RA8 may be incorporated into the predecoding path by other conventional combinatorial logic. The embodiment of FIG. 4 activates four rows per section at a time for all combinations of signals RA7 and RA8 unless RA7 and/or RA8 are incorporated into the predecode path.

FIG. 5 is a simplified schematic diagram of another test circuit 150 useful in the memory device 10 of FIG. 1 in accordance with an embodiment of the present invention. The test circuit 150 is also a modification of the even row drivers of the row address latch 26 of FIG. 1, with the inverter 112 (see FIG. 4) replaced by one side of a latch comprising two cross-coupled NOR gates 152, 154 that act as the inverter 112 when the signal TEST is inactive low. A NAND gate 156 decodes RA80 and TEST to determine when to set the global phase driver BPH active high.

These embodiments all cause the output node WL of FIG. 2 to remain active, i.e., to maintain a voltage of $V_{CCP}$, through multiple consecutive row activate commands. In these. embodiments, the output node WL is reset when either a PRECHARGE or a CLEAR TEST command takes effect and resets the signal TEST inactive low. An advantage of embodiments of the. present invention is that only a single test signal TEST is required in order to enter the test mode of operation.

The NOR gates 134–138, inverters 120, 122 and multiplexers 124, 126 function as in the circuit 100 of FIG. 4. Accordingly, operation of these circuits is not discussed further here.

Figure 6:
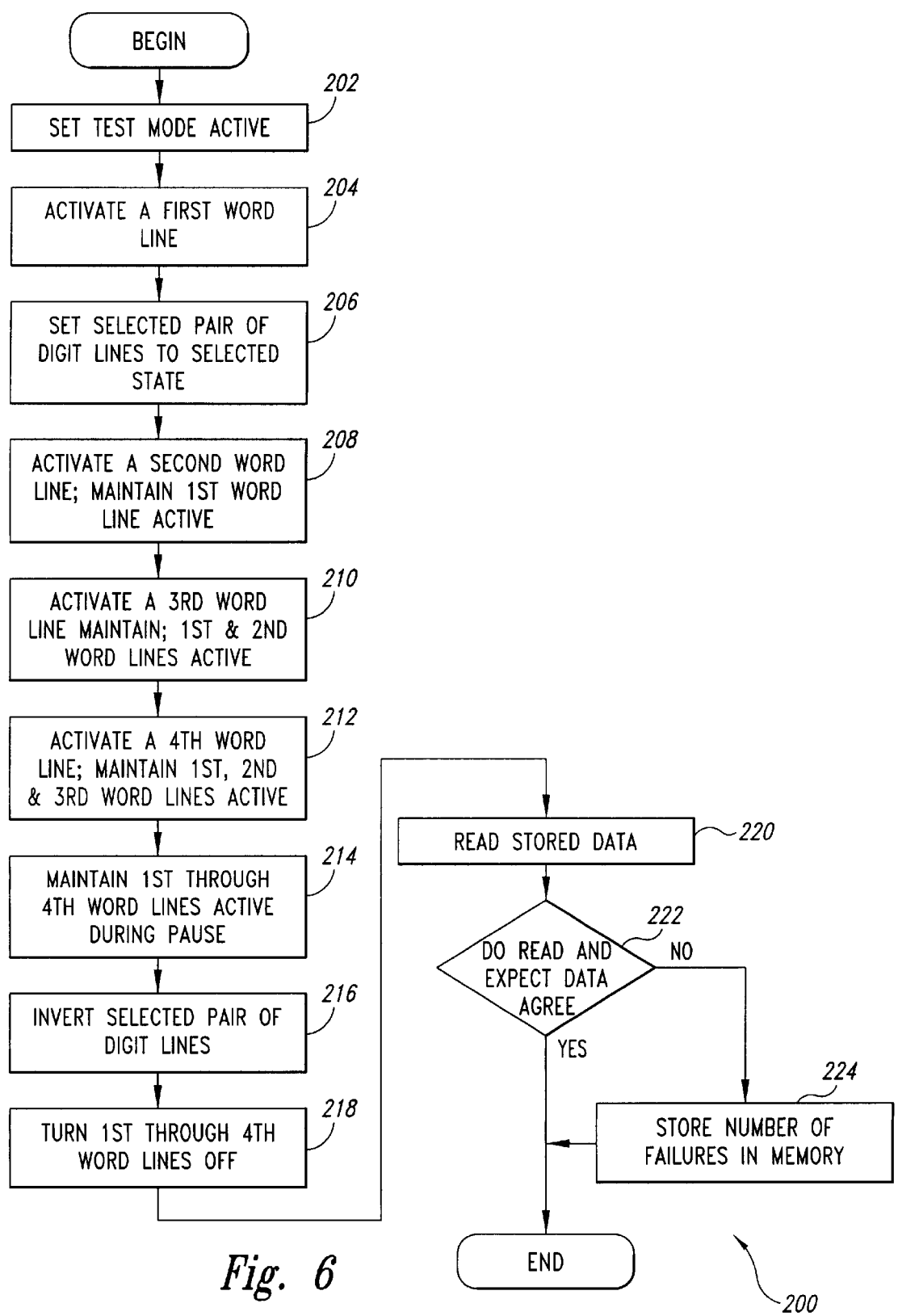
FIG. 6 is a simplified flow chart of a process for testing writeback margin for the memory device of FIG. 1 in accordance with an embodiment of the present invention.
Figure 7:
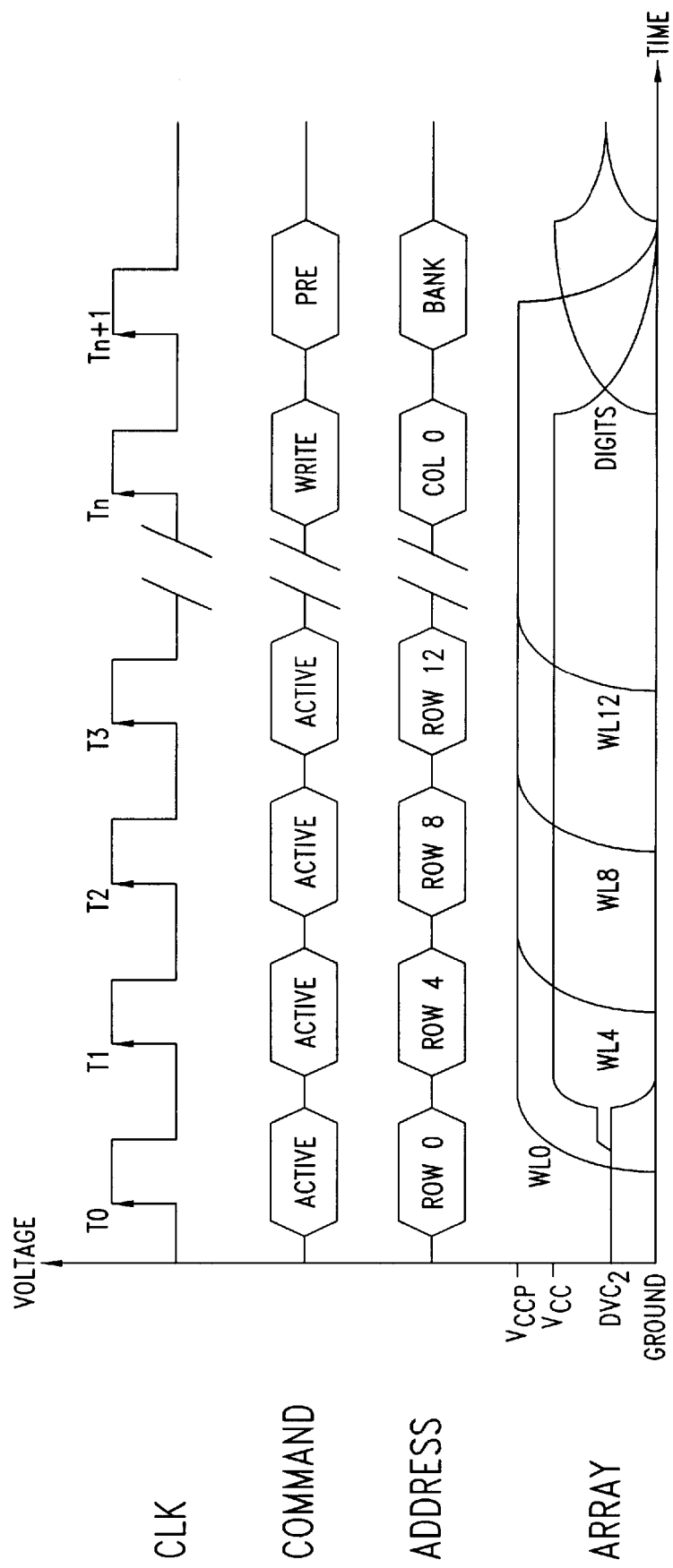
FIG. 7 is a simplified timing diagram for the process of FIG. 6, in accordance with an embodiment of the present invention.

FIG. 6 is a simplified flow chart of a process 200 for testing writeback margin for the memory device 10 of FIG. 1, and FIG. 7 is a simplified timing diagram for the process 200, in accordance with embodiments of the present invention. FIG. 7 shows waveforms CLK, corresponding to a clock signal; COMMAND, corresponding to commands that are active during a specific clock cycle; ADDRESS, corresponding to the address in the memory array 20, 22 of FIG. 1 that the commands are relevant to; and ARRAY, corresponding to several signals present in the memory array 20, 22, as given below in Table I. The word lines of the example of FIGS. 6 and 7 are arbitrary in an arbitrary order (and could be in any other arbitrary order).

TABLE I

| Label | Waveforms in ARRAY of FIG. 6. |
|---|---|
| WL0 | Word line 0 |
| WL4 | Word line 4 |
| WL8 | Word line 8 |
| WL12 | Word line 12 |
| DIGITS | signals present on digit line pair |

The process 200 of FIG. 6 begins with a step 202 of setting the signal TEST (FIG. 2) active high prior to a first clock cycle of a memory test, i.e., prior to T0 (see arrow, top trace, labeled CLK in FIG. 7). COMMAND is ACTIVE, i.e., data may now be read from or written to the memory arrays 20, 22 of FIG. 1. COMMAND stays in this state during the first four clock cycles of the process 200 in this example. During the first clock cycle, ADDRESS corresponds to ROW 0 and the word line driver circuit 75 of FIG. 2 for row 0 is activated. In a step 204, a first word line WL0 is activated on a rising edge of the first clock pulse, ie., at a time T0.

In a step 206, a pair of digit lines are set to data values DIGITS (bottom trace, FIG. 7), thereby addressing the data DIGITS to a first memory cell at an intersection of the pair of digit lines and the first word line WL0. In a step 208, a second word line WL4 is activated on a rising edge T1 of a second clock pulse immediately succeeding the first clock pulse, thereby addressing a second memory cell at the intersection of the pair of digit lines and the second word line WL4, and the first word line WL0 is maintained active.

In a step 210, a third word line WL8 is activated on a rising edge T2 of a third clock pulse immediately succeeding the second clock pulse, thereby addressing a third memory cell at the intersection of the pair of digit lines and the third word line WL8, and the first WL0 and second WL4 word lines are maintained active. In a step 212, a fourth word line WL12 is activated on a rising edge T3 of a fourth clock pulse immediately succeeding the third clock pulse, thereby addressing a fourth memory cell at the intersection of the pair of digit lines and the fourth word line WL12, and the first WL0, second WL4 and third WL8 word lines are maintained active.

In a step 214, the first WL0, second WL4, third WL8 and fourth WL12 word lines are maintained active during a pause of three to twenty microseconds, represented by slashes in FIG. 7. In a step 216, following the pause, the digital values DIGITS of the pair of digit lines are inverted at the falling edge of an $n^{TH}$ clock pulse, i.e., a sense amplifier associated with the pair of digit lines is driven to a logical state that is the inverse of the logical state of the sense amplifier in steps 206–212. In a step 218, on a rising edge at a time Tn+1 of an $n+1^{Th}$ clock pulse, the first through fourth word lines WL0–WL12 are turned off, storing values in the addressed memory cells that correspond to the state of the signals DIGITS on the pair of digit lines. In a step 220, the data stored in the memory cells that were addressed in steps 204–218 are read out.

A query task 222 compares the read data to corresponding expected values. When the query task 222 determines that one or more of the memory cells provided read data that do not agree with the expected data, the sense amplifier is not able to effectively drive the load of the combined addressed memory cells at that clock speed. In a task 224, data describing memory cell failures, such as the number of memory cell failures, is stored in a memory and the process 200 ends. When the query task 222 determines that the read data and the expected values agree, the sense amplifier is able to drive the load represented by the addressed memory cells at that clock speed, as is discussed below in more detail. The process 200 then ends.

The sense amplifiers in the column circuitry 50, 52 (FIG. 1) have an output resistance, and the digit lines are capacitive. As a result, the digit lines do not switch immediately and instead charge up or down over a period of time (see, e.g., the traces DIGITS at the bottom of FIG. 7 at times between T0 and T1 and to the right of Tn, as denoted at the top). When the second through fourth memory cells are added to the sense amplifier load, the time constant for charging the digit lines increases (compare DIGITS between T0 and T1 to DIGITS to the right of Tn). When the output resistance of the sense amplifier is too high, or when the clock speed is too fast, the signals DIGITS on the pair of digit lines will not have changed state before the first through fourth word lines WL0–WL12 were turned off at time Tn+1. As a result, the data stored in one or more of the first through fourth memory cells will be incorrect.

The present invention allows the number of word lines that are used in this type of test to be incremented by one word line at a time, providing finer granularity to the measured data than is possible with prior art writeback margin tests. As a result, it is possible to learn more about margin stress for the memory device 10 being tested than could be learned from prior art testing techniques.

Figure 8:
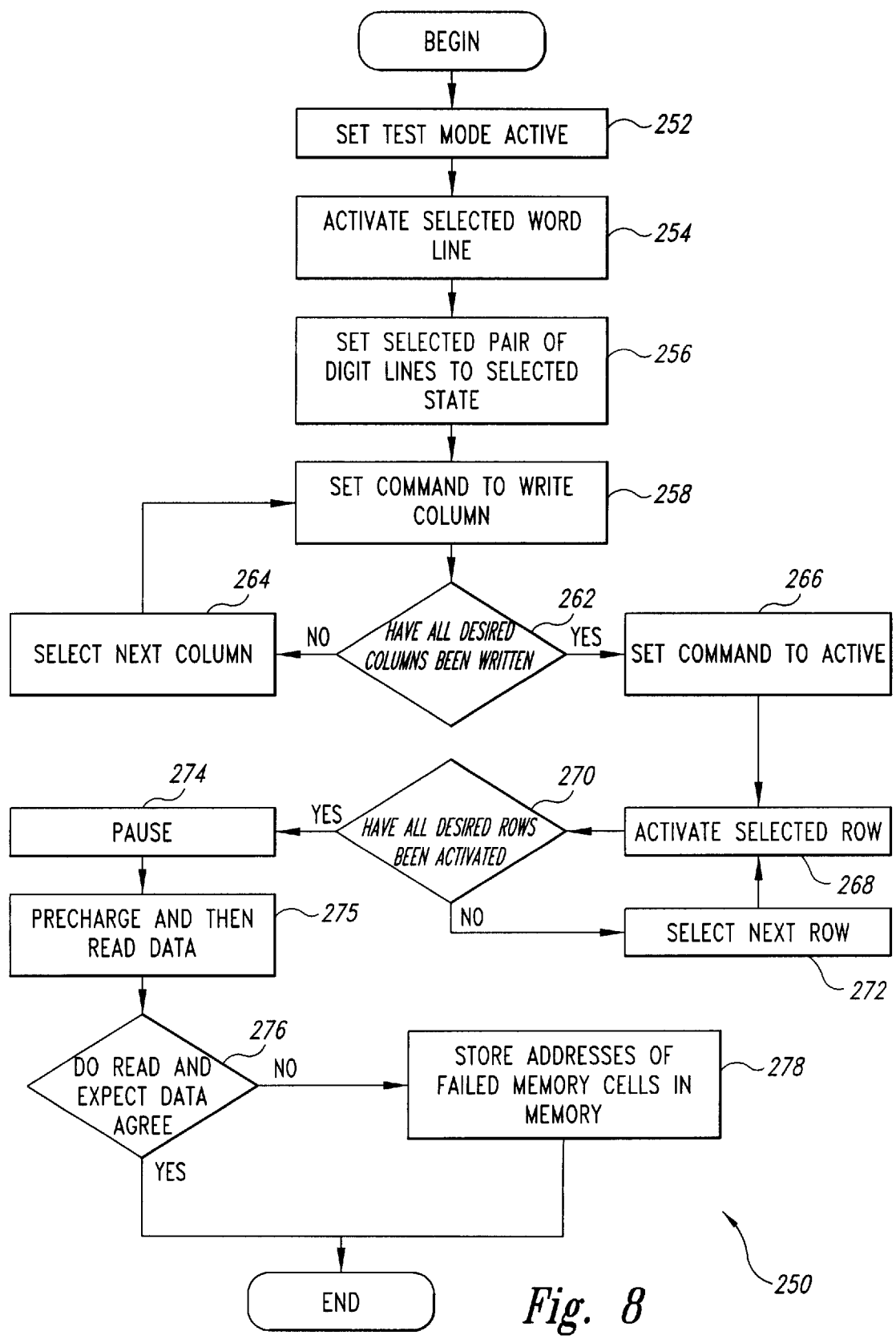
FIG. 8 is a simplified flow chart of a RASCLOBBER process for testing for leakage between cells for the memory device of FIG. 1, in accordance with an embodiment of the present invention.
Figure 9:
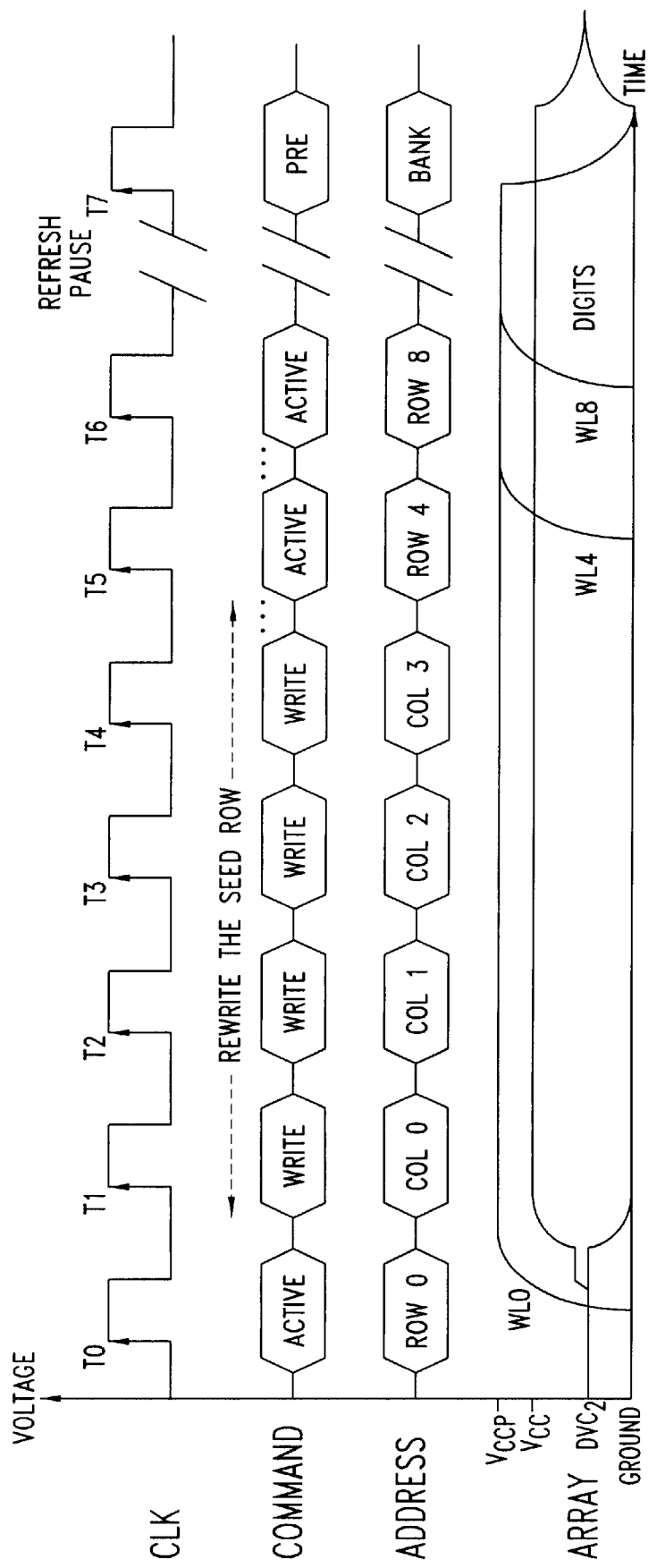
FIG. 9 is a simplified timing diagram for the process of FIG. 8, in accordance with embodiments of the present invention.

FIG. 8 is a simplified flow chart of a process 250 for RASCLOBBER testing for leakage between cells for the memory device 10 of FIG. 1, and FIG. 9 is a simplified timing diagram for the RASCLOBBER process 250, in accordance with embodiments of the present invention. Tests where a relatively long pause between writing a data pattern and reading data measures even small amounts of charge leaking from one memory cell to another are known as "CLOBBER" tests. When charge leakage is present, one or more memory cells adjacent to the memory cells to which data were written will "float" from a pre-programmed logical state to a voltage about halfway between the allowed states of logic "0" and logic "1" or to the value stored in the adjacent cell to which charge is leaking. FIG. 9 shows waveforms CLK, COMMAND, ADDRESS and ARRAY, having the same meanings as the corresponding waveforms illustrated in FIG. 7.

In a step 252 (FIG. 8), the signal TEST (FIGS. 4 and 5) is set active high prior to a first clock cycle of a memory test, i.e., to the left of an arrow at T0 (see the top trace labeled CLK in FIG. 9). COMMAND is ACTIVE, i.e., data may be read from or written to the memory arrays 20, 22 of FIG. 1. COMMAND stays in this state during those subsequent clock cycles in which columns are selected for re-writing a seed row. During the first clock cycle, i.e., while CLK is at logic "1" following time T0 (top trace, FIG. 9), ADDRESS corresponds to, for example, ROW 0 and the word line driver circuit 75 of FIG. 2 for row 0 is activated. In a step 254, a first word line WL0 is activated on a rising edge (at T0) of the first clock cycle.

In a step 256, a pair of digit lines are set to data values DIGITS (bottom trace, FIG. 9), thereby addressing data to memory cells coupled to the pair of digit lines. In a step 258, COMMAND is set to WRITE and a selected column, for example COL 0, is written on a rising edge T1 of a second clock cycle immediately succeeding the first clock cycle, thereby addressing and writing data to an addressed memory cell. The step 258 also includes providing the row address and the bank address to specify the addressed memory cell to which the data represented by DIGITS is being written. COMMAND stays in the WRITE state for the next three clock cycles in the example of FIG. 9.

A query task 262 then determines if all of the desired columns have been written. When the query task 262 determines that not all of the desired columns have been written, a next desired column is selected in a step 264 and control passes back to the step 258. The steps 264, 258 and 262 then repeat until the query task 262 determines that all of the desired columns have been addressed, i.e., the new seed row has had data written to it, or the seed row has been rewritten with new data. In the example of FIGS. 8 and 9, memory cells located at the intersection of columns 0–4 and row 0 form at least part of the seed row. Then, in a step 266, COMMAND is set to ACTIVE. In a step 268, a selected row is activated to copy the data that were written to the seed row into the selected row.

A query task 270 then determines if all of the desired rows have been activated. When the query task 270 determines that not all of the desired rows have been activated, a next desired row is selected in a step 272 and control passes back to the step 268. The steps 272, 268 and 270 repeat until the query task 270 determines that all of the desired rows have been addressed, i.e., the data from the seed row have been written to the desired rows (ROW 4 and ROW 8 in the example of FIGS. 8 and 9). The steps 254–270 require that the local phase signals LPH* be latched active low during these steps for at least these rows. Then, in a step 274, a pause is introduced (denoted by slashes in FIG. 9) generally on the order of 32 to 100 milliseconds but which may be longer or shorter. The pause in step 274 allows defective memory cells to discharge through high resistance interconnects to memory cells adjacent to the cells to which data were written during the steps 260–272. The precharge command shuts off all row lines at the end of the pause time.

In the step 275, data are read normally (ie., per specifications) from the memory cells. A query task 276 determines if the read data agree with corresponding expect data. When the query task 276 determines that the read data and the corresponding expect data agree, the process 250 ends. When the read data and the corresponding expect data do not agree, the addresses of failed memory cells are stored in a memory in a step 278. The process 250 then ends.

As a result of the dynamic latching capability of the write line driver circuit 75 of FIG. 2, and the software programmability of the present invention, any row may be used as the seed row and the rows to which data are written from the seed row may be chosen under software control.

Figure 10:
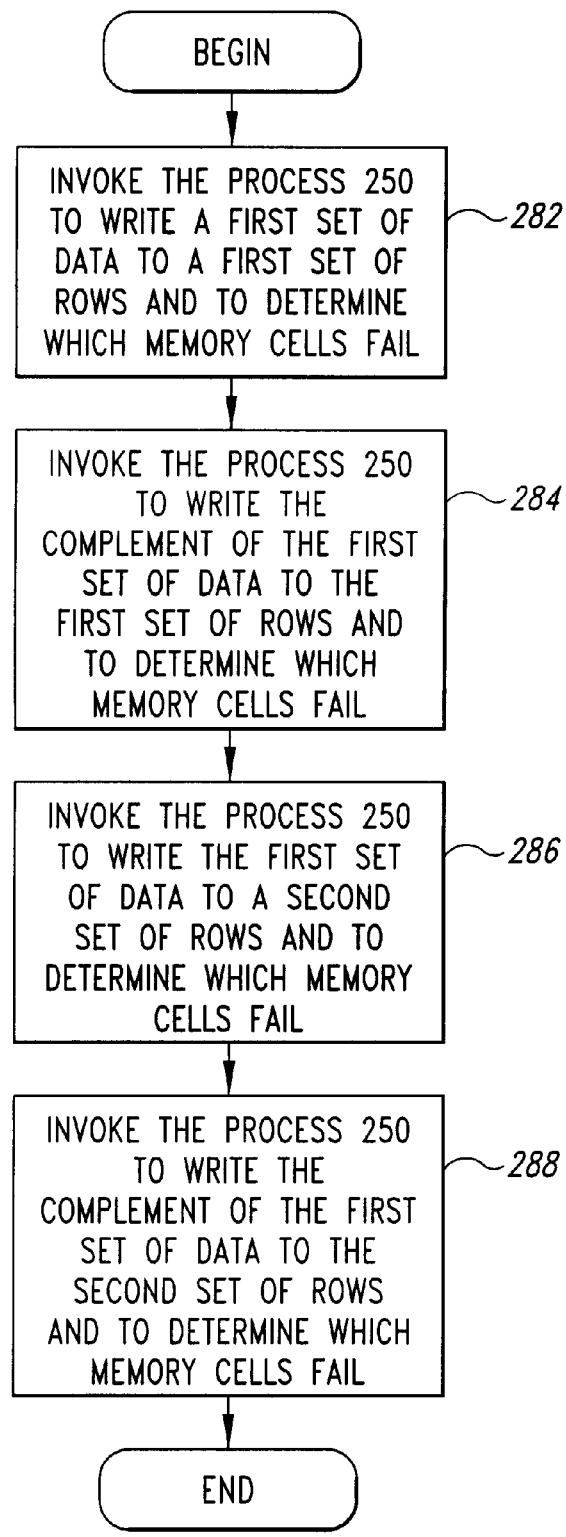
FIG. 10 is a simplified flow chart of a process that repeatedly invokes the RASCLOBBER process of FIG. 8 to test the memory device of FIG. 1, in accordance with an embodiment of the present invention.

FIG. 10 is a flowchart of a process 280 that repeatedly uses the RASCLOBBER process 250 of FIG. 8 to test the memory arrays 20, 22 of FIG. 1. In a step 282, the process 250 is invoked to write a first set of data, DATA, to, e.g., all the even rows, and to determine which, if any, memory cells fail. For example, all of the even rows could be written to logical "1" and all of the odd rows to logical "0," or a "checkerboard" pattern could be used. In a step 284, the process 250 (FIG. 8) is invoked to write the complement of the first set of data, DATA*, to all of the even rows, and to determine which, if any, memory cells fail. In a step 286, the process 250 is invoked to write the first set of data, DATA, to all of the odd rows, and to determine which, if any, memory cells fail. In a step 288, the process 280 is invoked to write the complement of the first set of data, DATA*, to all of the odd rows, and to determine which, if any, memory cells fail. The process 280 then ends. The process 280 thus tests each memory cell in the memory arrays 20, 22 of FIG. 1 in each logical state, i.e., logic "0" and logic "1," to determine if a high resistance interconnection exists between any memory cell and the neighboring memory cells.

In a typical RASCLOBBER test, where a 48 millisecond delay is used in the step 272 for the pause, and 16,000 rows need to be tested, a total test time of about 800 seconds is required to test the memory arrays 20, 22 of FIG. 1 if the rows are tested one at a time. Prior art approaches turn groups of rows on simultaneously, resulting in large charging currents that may cause interference, and are inflexible in that only predetermined groups of rows may be turned on together.

The embodiments of the present invention allow rows to be turned on one at a time, in any order and in any combination. As a result, test time is reduced and flexibility in testing is possible. When a row is initially written to as the chosen seed row and the read data suggest that the seed row may be defective, embodiments of the present invention allow either that seed row to be rewritten or a new seed row to be chosen. For example, when a seed row includes a memory cell that is shorted to ground, all of the other memory cells that are coupled to that memory cell will store a logic "0." When the data are read from the memory arrays 20, 22, the presence of a short circuit will be seen to be likely.

Although the present invention has been described with reference to a preferred embodiment, the invention is not limited to this pr6ferred embodiment. Rather, the invention is limited only by the appended claims, which include within their scope all equivalent devices or methods which operate according to the principles of the invention as described.

What is claimed is:

1. In a memory device having a plurality of memory cells arranged in rows and columns, each row coupled to a word line driver circuit including a dynamic latch, a method of refreshing activated dynamic latches in a test mode comprising:
maintaining a phase driving signal in an active state; and
sequentially retriggering each word line driver latch with a word line driver circuit selection signal.

2. The method of claim 1, further comprising triggering an additional word line driver circuit to increment a number of active word line driver circuits.

3. The method of claim 1, further comprising triggering a series of additional word line driver circuits, one per each of a series of clock cycles, to sequentially increment a number of active word line driver circuits.

4. The method of claim 1, further comprising triggering a series of additional word line driver circuits, one per each of a series of clock cycles, to sequentially increment a number of active word line driver circuits, wherein an order in which the additional word line driver circuits are activated is arbitrary and is controlled by software.

5. A method for activating rows of memory cells in a memory device having a plurality of memory arrays arranged in rows and columns of memory cells, each row of memory cells coupled to a word line driver circuit, the method comprising:
activating the word line driver circuits of the memory device;
triggering a selected plurality of activated word line driver circuits to activate a corresponding plurality of rows of memory cells that belong to the same memory array; and
periodically re-triggering the selected plurality of word line driver circuits.

6. The method of claim 5 wherein the word line driver circuit includes a dynamic latch and the periodic re-triggering comprises refreshing the dynamic latches.

7. The method of claim 5 wherein triggering the selected plurality of activated word line driver circuits is performed simultaneously.

8. The method of claim 5 wherein triggering the selected plurality of activated word line driver circuits is performed sequentially.

9. The method of claim 5 wherein re-triggering the selected plurality of activated word line driver circuits is performed simultaneously.

10. The method of claim 5 wherein re-triggering the selected plurality of activated word line driver circuits is performed sequentially.

11. The method of claim 5, further comprising selecting a column of memory cells and setting the selected column to a first logic state.

12. The method of claim 11 wherein setting the selected column comprises writing data corresponding to the first logic state to a memory cell at the intersection of selected column and the row of memory cells coupled to the word line driver circuit first triggered.

13. In a memory device having a plurality of memory cells arranged in rows and columns, each row coupled to a word line driver circuit including a dynamic latch, a method of refreshing activated dynamic latches in a test mode comprising:
maintaining a phase driving signal in an active state to maintain activation of the dynamic latches; and
re-triggering each word line driver latch with a word line driver circuit selection signal.

14. The method of claim 13, further comprising sequentially triggering a plurality of word line driver latches.

15. The method of claim 13, wherein the plurality of word line driver latches activate a corresponding plurality of adjacent rows of memory cells.

16. The method of claim 13, further comprising triggering a series of additional word line driver circuits, one per each of a series of clock cycles, to sequentially increment the number of active word line driver circuits.

17. The method of claim 13, further comprising triggering a series of additional word line driver circuits, one per each of a series of clock cycles, to sequentially increment the number of active word line driver circuits, wherein an order in which the additional word line driver circuits are activated is arbitrary and is controlled by software.

18. The method of claim 13, further comprising selecting a column of memory cells and setting the selected column to a first logic state.

19. A method for activating rows of memory cells in a memory device having a plurality of memory arrays arranged in rows and columns of memory cells, each row of memory cells coupled to a word line driver circuit, the method comprising:

activating the word line driver circuits of the memory device;

coupling for a time period a selected plurality of rows of memory cells that belong to the same memory array to a first voltage supply; and periodically re-coupling the selected plurality of word line driver circuits to the first voltage supply.

20. The method of claim 19 wherein activating the word line driver circuits comprises de-coupling the word lines from a second voltage supply.

21. The method of claim 19 wherein the word line driver circuit includes a dynamic latch and the periodic re-coupling comprises sets the dynamic latches in a state.

22. The method of claim 19 wherein coupling the selected plurality of rows of memory cells is performed simultaneously.

23. The method of claim 19 wherein coupling the selected plurality of rows of memory cells is performed sequentially.

24. The method of claim 19 wherein re-coupling the selected plurality of rows of memory is performed simultaneously.

25. The method of claim 19 wherein re-coupling the selected plurality of rows of memory is performed sequentially.

26. The method of claim 19, further comprising selecting a column of memory cells and setting the selected column to a first logic state.

27. The method of claim 26 wherein setting the selected column comprises writing data corresponding to the first logic state to a memory cell at the intersection of selected column and the row of memory cells coupled to the word line driver circuit first triggered.

* * * * *

UNITED STATES PATENT AND TRADEMARK OFFICE
CERTIFICATE OF CORRECTION

PATENT NO.    : 6,292,421 B1
DATED         : September 18, 2001
INVENTOR(S)   : Michael A. Shore and Patrick J. Mullarkey It is certified that error appears in the above-identified patent and that said Letters Patent is hereby corrected as shown below:

<u>Column 13,</u>
Line 3, "13" should read -- 14 --

Signed and Sealed this

Twenty-third Day of July, 2002

*Attest:*

*Attesting Officer*

JAMES E. ROGAN
*Director of the United States Patent and Trademark Office*